United States Patent [19]

Kanazawa

[11] Patent Number: 5,565,776
[45] Date of Patent: Oct. 15, 1996

[54] MAGNETIC RESONANCE IMAGING APPARATUS

[75] Inventor: Hitoshi Kanazawa, Tochigi-ken, Japan

[73] Assignee: Kabushiki Kaisha Toshiba, Kawasaki, Japan

[21] Appl. No.: 518,201

[22] Filed: Aug. 23, 1995

[30] Foreign Application Priority Data

Aug. 26, 1994 [JP] Japan ................................ 6-202436

[51] Int. Cl.$^6$ .................................................. G01V 3/00
[52] U.S. Cl. ....................... 324/306; 324/309; 128/653.3
[58] Field of Search ............................. 324/300, 306, 324/303, 307, 309, 318, 322; 128/653.2, 653.3, 653.4

[56] References Cited

U.S. PATENT DOCUMENTS 5,225,779  7/1993  Parker et al. ............................ 324/306

OTHER PUBLICATIONS

Magnetic Resonance in Medicine vol. 23, pp. 138–153, 1992; "One–Shot Velocity Microscopy: NMR Imaging of Motion Using a Single Phase–Encoding Step"; Yang Xia and Paul T. Callaghan; received Sep. 17, 1990.
Magnetic Resonance in Medicine, vol. 3, pp. 823–833, 1986 "RARE Imaging: A Fast Imaging Method for Clinical MR" J. Hennig, A. Nauerth and H. Friedburg; received May 6, 1985; revised Apr. 14, 1986.
Magnetic Resonance Imaging, vol. 6, pp. 397–407, 1988; "Multiecho Imaging Sequences with Low Refocusing Flip Angles"; J. Hennig; received Jan. 8, 1987; revised Nov. 25, 1987.
Magnetic Resonance Imaging, vol. 1, pp. 197–203, 1982; "A Flow Velocity Zeugmatographic Interlace for NMR Imaging in Humans"; Paul R. Moran, Ph.D.; received Feb. 11, 1983.
Rodiology, vol. 177, pp. 45–50, 1990; "Extracranial Carotid Arteries: Evaluation with Black Blood MR Angiography 1", Robert R. Edelman, MD., et al.; received May 30, 1990.

Magnetic Resonance in Medicine, vol. 30, pp. 183–190, 1993; "Stabilization of Echo Amplitudes in FSE Sequences"; Patrick Le Roux and R. Soctt Hinks; received Nov. 16, 1992.
Proc. of Annual Meeting of Society of Magnetic Resonance in Medicine, p. 53, 1989 "Imaging of Heart Wall Motion Using MR–Interferography"; J. Hennig and H. Friedburg; 1989.
Magnetic Resonance in Medicine, vol. 32, pp. 698–706, 1994; "Gradient Moment Nulling in Fast Spin Echo"; R. Scott Hinks and R. Todd Constable; received May 26, 1993.
Magnetic Resonance Imaging, vol. 12, No. 4, pp. 605–611, 1994; "Acquisition of Spin Echo and Stimulated Echo by a Signle Sequence: Application to MRI of Diffusion"; F. Franconi et al.

*Primary Examiner*—Michael Tokar
*Attorney, Agent, or Firm*—Limbach & Limbach L.L.P.

[57] ABSTRACT

An excitation pulse, a first refocusing pulse, and a second refocusing pulse are sequentially applied, a flow encode pulse for producing a phase shift in accordance with the velocity of a fluid is applied before the second refocusing pulse, an echo signal is observed after the application of the second refocusing pulse, and a velocity image is reconstructed on the basis of the echo signal. The application phases of the excitation pulse, the first refocusing pulse, and the second refocusing pulse, and the flip angles of the first and second refocusing pulses, are so adjusted that the intensity of the echo signal from the fluid changes in accordance with the velocity. In a stationary part, the absolute value of a spin echo component and the absolute value of a stimulated echo component are equal, and the phase difference between them is 180°. That is, the signal in the stationary part is essentially 0. In a fluid, the absolute values of the spin echo component and the stimulated echo component are equal, and the phase difference between them approaches 0° with increasing velocity. That is, the signal intensity in the fluid increases as the velocity increases. Accordingly, only an echo signal from the fluid can be observed. The intensity of this echo signal increases with velocity. On the basis of the echo signal, the fluid, rather than the stationary part, is imaged, and a velocity image whose luminance changes in accordance with the velocity is reconstructed.

34 Claims, 8 Drawing Sheets

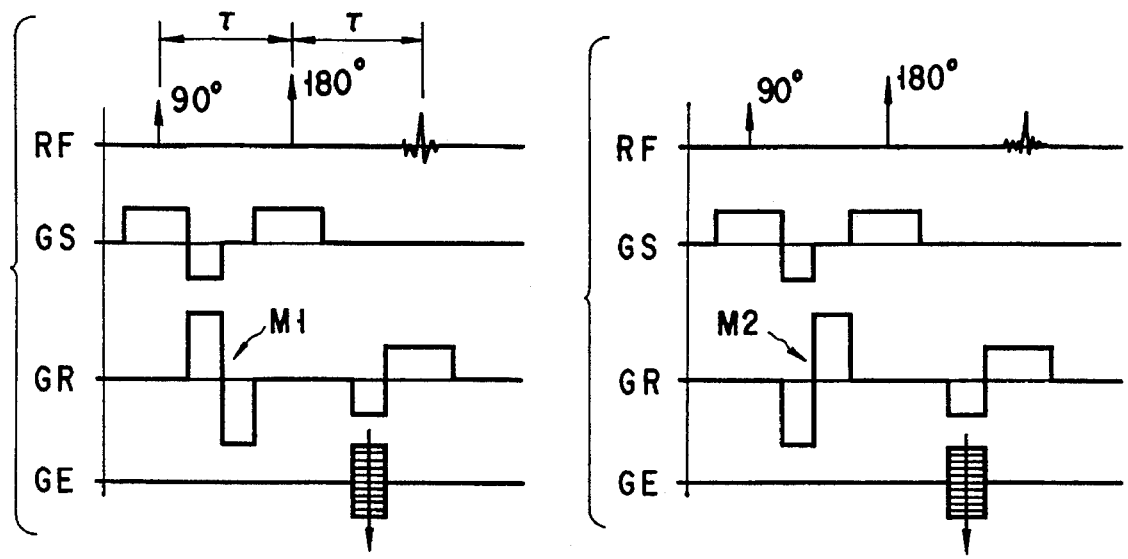
F I G. 1A
(PRIOR ART)
F I G. 1B
(PRIOR ART)
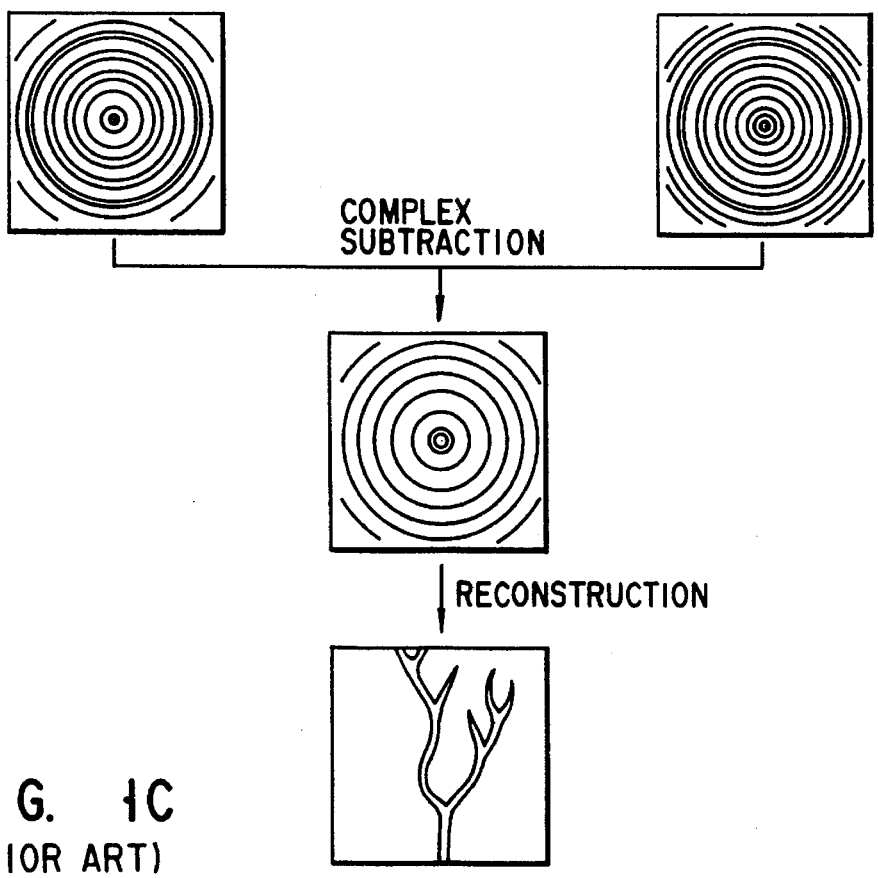
F I G. 1C
(PRIOR ART)

ECHO DATA (K-SPACE)

RECONSTRUCTION (2-DIRECTION FOURIER TRANSFORMATION (2DFT))

VELOCITY IMAGE

MAGNETIC RESONANCE IMAGING APPARATUS

BACKGROUND OF THE INVENTION

1. Field of the Invention

The present invention relates to a magnetic resonance imaging apparatus for imaging a fluid such as a bloodstream.

2. Description of the Related Art

A phase contrast method separates a fluid from a stationary tissue on the principle that the phase of a spin moving along a magnetic gradient shifts. In this method, as illustrated in FIGS. 1A, 1B, and 1C, two different echo data are obtained by applying ±A flow encode pulses M1 and M2 to a fluid in the A-direction, and a velocity image is reconstructed from the data as a result of the complex subtraction of the two echo data.

As another method of imaging a fluid, a method using stimulated echoes and "z-storage" radio-frequency (RF) pulses is introduced in "Magnetic Resonance in Medicine", Vol. 23, pp. 138–153 (1992). A flow encode pulse is a bipolar pulse. In this method, to enlarge a low-velocity region which can be imaged, the phase state of a spin after the first unipolar pulse is stored as longitudinal magnetization having a time constant which is generally an order of magnitude longer than that of transverse magnetization by using an RF pulse with a flip angle of 90°, thereby making it possible to extend the time length between the bipolar pulses. Additionally, with respect to transverse magnetization whose velocity is encoded, transverse magnetization of a stationary tissue is shifted to longitudinal magnetization by using a 90° pulse called a z-storage pulse. Consequently, only fluid information is extracted, and a velocity image is obtained.

Unfortunately, these conventional methods discussed above have the following problems.

That is, the former method necessitates a double photographing time in order to run the two different pulse sequences, FIGS. 1A and 1B. Additionally, a motor artifact readily takes place due to the time difference between the two pulse sequences. Also, signal processing such as echo data subtraction is complicated.

In the latter method, on the other hand, the S/N ratio is low since only the stimulated echoes contribute to imaging. Also, multi-slice photographing is impossible.

SUMMARY OF THE INVENTION

It is an object of the present invention to provide a magnetic resonance imaging apparatus which performs imaging within short time periods with simplified signal processing, which reduces any motor artifact, and which can improve the S/N ratio.

The present invention provides a magnetic resonance imaging apparatus, wherein an excitation pulse, a first refocusing pulse, and a second refocusing pulse are sequentially applied, a flow encode pulse for producing a phase shift in accordance with a velocity of a fluid is applied before the second refocusing pulse, an echo signal is observed after the application of the second refocusing pulse, and a velocity image is reconstructed on the basis of the echo signal, and application phases of the excitation pulse, the first refocusing pulse, and the second refocusing pulse, and flip angles of the first and second refocusing pulses, are so adjusted that an intensity of the echo signal from the fluid changes in accordance with the velocity.

As an example, in a stationary part the absolute value of a spin echo component equals the absolute value of a stimulated echo component and the phase difference between the two is 180°. That is, the signal in the stationary part is essentially 0. On the other hand, in a fluid the absolute value of a spin echo component equals the absolute value of a stimulated echo component and the phase difference between the two approaches 0° as the velocity increases. That is, the signal intensity of the fluid increases with velocity. Consequently, only an echo signal from the fluid can be observed. Also, the intensity of this echo signal increases with velocity. The fluid, rather than the stationary part, is imaged on the basis of the echo signal, and a velocity image whose luminance changes with velocity is reconstructed.

Since it is not necessary to run two different pulse sequences, the imaging time is shortened, no subtraction processing is required, and generation of a motor artifact is reduced. Additionally, the S/N ratio is improved because both the spin echo component and the stimulated echo component contribute to imaging and the signal intensity increases with velocity.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIGS. 1A to 1C are views for explaining a conventional phase contrast method;

DETAILED DESCRIPTION OF THE PREFERRED EMBODIMENT

One embodiment of the present invention will be described below with reference to the accompanying drawings.

Figure 2:
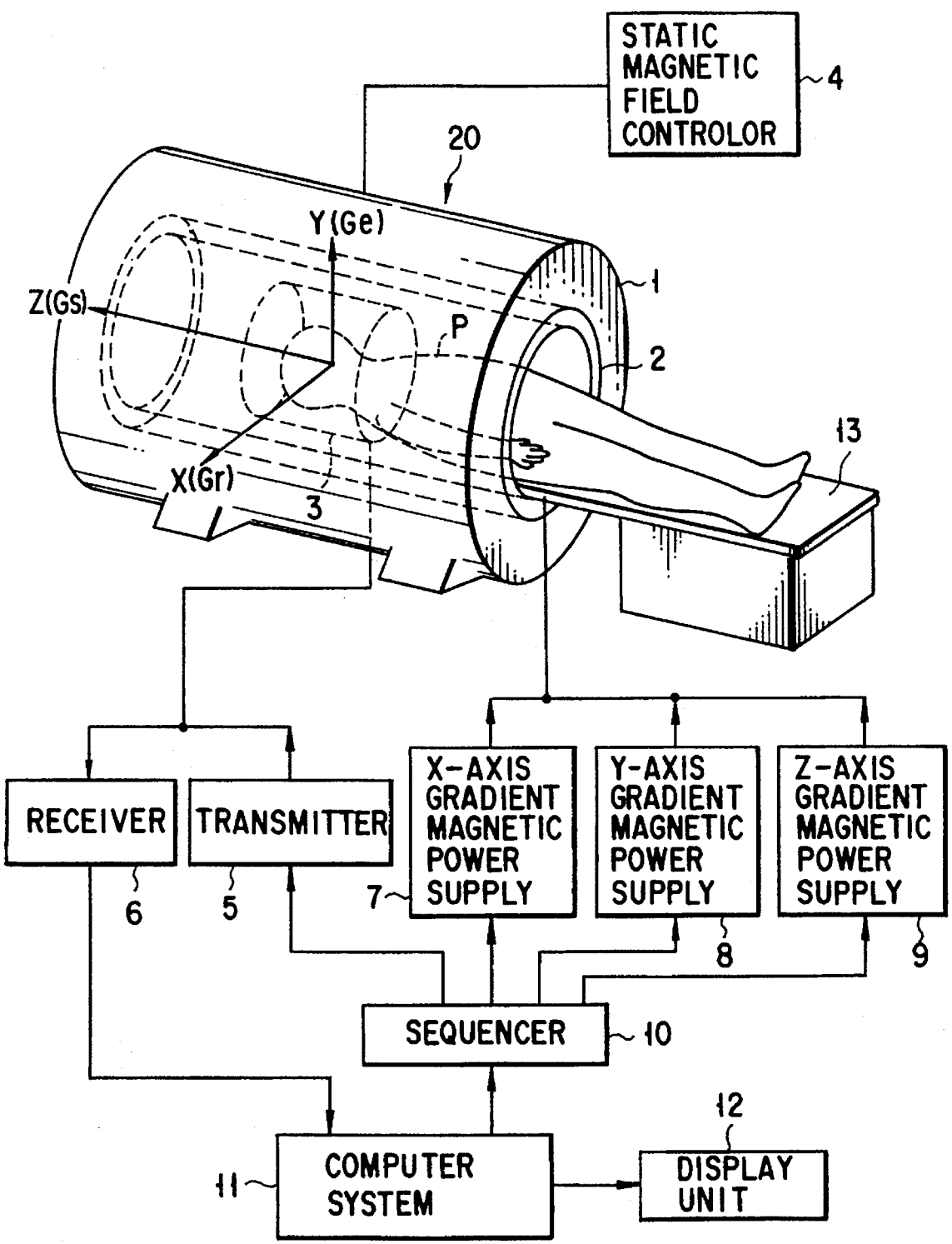
FIG. 2 is a block diagram showing the arrangement of the magnetic resonance imaging apparatus according to an embodiment.

FIG. 2 is a block diagram showing the arrangement of a magnetic resonance imaging apparatus according to the preferred embodiment of the present invention. A coil assembly 2 having a cylindrical internal space for accommodating an object to be examined (patient) P includes a static magnetic field magnet unit 1, a gradient coil unit 2, and a transmission/reception coil 3. The static magnetic field magnet unit 1, which is constituted by a permanent magnet, a normal conducting magnet, or a superconducting magnet, forms a static magnetic field along the Z axis inside the cylinder under the control of a static magnetic field controller 4. For illustrative convenience, assume that the Z axis is parallel to the body axis of the patient P, the X axis is perpendicular to the Z axis, and the Y axis is perpendicular to both the Z and X axes.

The gradient coil unit 2 has three gradient coils of the X, Y, and Z axes. The X-axis gradient coil is supplied with a current from an X-axis gradient magnetic power supply 7 and generates an X-axis gradient magnetic field whose magnetic intensity has a gradient along the X axis. The Y-axis gradient coil is supplied with a current from a Y-axis gradient magnetic power supply 8 and generates a Y-axis gradient magnetic field whose magnetic intensity changes along the Y axis. The Z-axis gradient coil is supplied with a current from a Z-axis gradient magnetic power supply 9 and generates a Z-axis gradient magnetic field whose magnetic intensity changes along the Z axis. Note it is assumed that the X-axis gradient magnetic field is used as a readout gradient magnetic field GR for frequency encode, the Y-axis gradient magnetic field is used as a phase encode gradient magnetic field GE, and the z-axis gradient magnetic field is used as a slice gradient magnetic field GS. Data acquisition is possible in a region in which the magnetic intensities of these X, Y, and Z axes linearly change, and this region will be referred to as a photographable region hereinafter. In performing data acquisition, the patient is placed on the top plate of a bed 13 and inserted into the photographable region.

The transmission/reception coil 3 is connected to a transmitter 5 in excitation, and connected to a receiver 6 in reception. The transmission/reception coil 3 is supplied with a current from the transmitter 5 and generates a selective excitation pulse having a specific frequency component. As a consequence, only a magnetization spin present at a position Z corresponding to this frequency is selectively excited. A magnetic resonance signal generated from the magnetization spin after this excitation is induced in the transmission/reception coil 3.

A sequencer 10 executes a pulse sequence (to be described later) by controlling the gradient magnetic power supplies 7, 8, and 9, the transmitter 5, and the receiver 6. A computer system 11 controls the operation of the whole system. Also, the computer system 11 receives the magnetic resonance signal from the transmission/reception coil 3 via the receiver 6 and forms a magnetic resonance image (velocity image). This image is displayed on a display unit 12.

Figure 3:
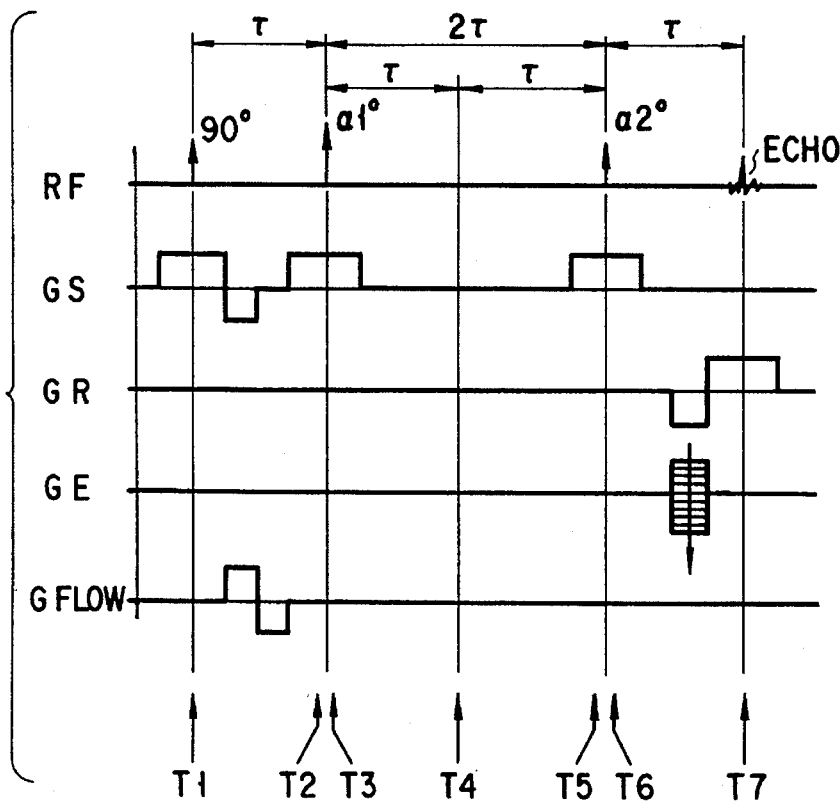
FIG. 3 is a view showing a pulse sequence of the embodiment.

The operation of the above apparatus will be described below. FIG. 3 shows the pulse sequence of this embodiment. An excitation pulse having a flip angle of 90° is applied to the patient in the presence of the slice gradient magnetic field GS. When time $\tau$ elapses from the excitation pulse, a first refocusing pulse with a flip angle of $\alpha_1°$ is applied to the patient in the presence of the slice gradient magnetic field GS. When time $2\tau$ elapses from the first refocusing pulse, a second refocusing pulse with a flip angle of $\alpha_2°$ is applied to the patient in the presence of the slice gradient magnetic field GS.

Between the excitation pulse and the first refocusing pulse, a flow encode pulse Gflow which is a bipolar pulse whose polarity reverses is applied such that the magnetic intensity changes along the direction of the flow of a fluid to be imaged. The application timing of the flow encode pulse Gflow can be anywhere between the excitation pulse and the second refocusing pulse. As is well known, the area (application time x amplitude) of a pulse of one polarity of the flow encode pulse Gflow is so adjusted as to be equal to the area of a pulse of the other polarity. As a result, due to the difference between magnetic fields which the pulse encounters, the phase shift becomes 0 in a stationary part, and the phase shifts with velocity in a fluid.

When time $\tau$ elapses from the second refocusing pulse, the magnetic resonance signal (echo) is sampled in the presence of the readout gradient magnetic field GR.

The application phases of the excitation pulse, the first refocusing pulse, and the second refocusing pulse will be described below. The application phase is defined as an angle formed between the rotation central axis and the X axis when a magnetization spin flips. For example, when the excitation pulse is applied with an application phase of 0°, the magnetization spin flips 90° from the X axis. These application phases are adjusted under the following conditions.

Assume that the application phases of the excitation pulse, the first refocusing pulse, and the second refocusing pulse are $\phi_0$, $\phi_1$, and $\phi_2$, respectively. A phase difference $\Delta\theta$ between the spin echo component and the stimulated echo component generated after the second refocusing pulse is represented by Equation (1) below:

$$\Delta\theta = 2\cdot\phi_0 - 3\cdot\phi_1 + \phi_2 + \pi + 2n\cdot\pi \qquad (1)$$

where n is an integer

Deforming Equation (1) such that the phase difference $\Delta\theta$ between the spin echo component and the stimulated echo component in a stationary part is $\pi$ yields Equation (2) below:

$$2\cdot\phi_0 - 3\cdot\phi_1 + \phi_2 = 2\cdot n\cdot\pi \qquad (2)$$

The application phases of the excitation pulse, the first refocusing pulse, and the second refocusing pulse are so determined as to meet Equation (2). Consequently, in a stationary part the phase difference $\Delta\theta$ between the spin echo component and the stimulated echo component is $\pi$, so the spin echo component and the stimulated echo component cancel each other out. In a fluid, on the other hand, the phase difference $\Delta\theta$ between the spin echo component and the stimulated echo component approaches 0° as the velocity increases, so the spin echo component and the stimulated echo component combine with each other at the ratio corresponding to the velocity. This means that the signal intensity from the fluid increases with increasing velocity.

$\phi_0 = \phi_1 = \phi_2 = 0°$ is an example of the combination meeting Equation (2); that is, in this case all of the excitation pulse, the first refocusing pulse, and the second refocusing pulse are applied with respect to the X axis.

Note that if it is intended to lower the signal in a high-velocity portion such as in black blood imaging, it is only necessary to set the phase difference $\Delta\theta$ in a stationary part to 0. That is, the application phases of the excitation pulse, the first refocusing pulse, and the second refocusing pulse need only be so adjusted as to satisfy Equation (3) below:

$$2\cdot\phi_0 - 3\cdot\phi_1 + \phi_2 = (2n+1)\cdot\pi \qquad (3)$$

It is also possible to obtain images of various contrasts by setting the phase difference $\Delta\theta$ in a stationary part at an arbitrary angle.

The flip angles of the first and second refocusing pulses will be described below. The intensities of the spin echo component and the stimulated echo component generated after the second refocusing pulse will be represented as Ise and Iste, respectively. Assume that $T_1 = \infty$ and $T_2 = \infty$ neglecting $T_1$ and $T_2$ relaxation of a tissue, and that the magnitude of a transverse magnetization component after the excitation pulse is 1. The signal intensity Ise of the spin echo component is given by Equation (4) below, and the signal intensity Iste of the stimulated echo component is given by Equation (5) below:

$$Ise = \sin^2(\alpha_1/2)\cdot\sin^2(\alpha_2/2) \qquad (4)$$

$$Iste = 2\cdot\sin(\alpha_1/2)\cdot\cos(\alpha_1/2)\cdot\sin(\alpha_2/2)\cdot\cos(\alpha_2/2) \qquad (5)$$

If Ise=Iste, Equation (6) is obtained from Equations (4) and (5):

$$\sin(\alpha_1/2)\cdot\sin(\alpha_2/2) = 2\cdot\cos(\alpha_1/2)\cdot\cos(\alpha_2/2) \qquad (6)$$

The flip angle $\alpha_1°$ of the first refocusing pulse and the flip angle $\alpha_2°$ of the second refocusing pulse are so determined as to satisfy Equation (6). For example, $\alpha_1° = \alpha_2° = 109.5°$ is set. Consequently, the absolute value of the signal intensity of the spin echo component becomes equal to the absolute value of the signal intensity of the stimulated echo component.

As discussed above, when the application phases of the excitation pulse, the first refocusing pulse, and the second refocusing pulse are adjusted in accordance with Equation (2) and the flip angles of the first and second refocusing pulses are adjusted in accordance with Equation (6), in a stationary part the absolute values of the signal intensities of the spin echo component and the stimulated echo component become equal to each other and the phase difference between them becomes 180°. That is, the signal in the stationary part is essentially 0. On the other hand, in a fluid the absolute values of the spin echo component and the stimulated echo component become equal to each other and the phase difference between them approaches 0° with increasing velocity. That is, the signal intensity in the fluid increases with velocity.

Figure 4:
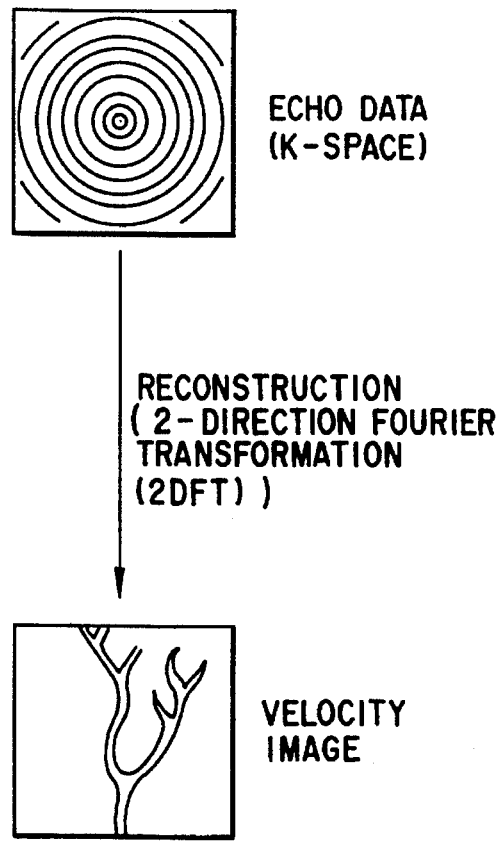
FIG. 4 is a view showing changes with time of the magnetization components of a stationary part, a fluid of $v_{max}/2$, and a fluid of $v_{max}$ in the pulse sequence in FIG. 3.

As shown in FIG. 4, the echo data thus acquired is subjected to two-dimensional Fourier transformation (2DFT) as normal reconstruction processing by the computer system 11. As a result, a velocity image is reconstructed such that only the fluid such as a bloodstream, rather than the stationary part, is imaged with luminance corresponding to the velocity.

Figure 5:
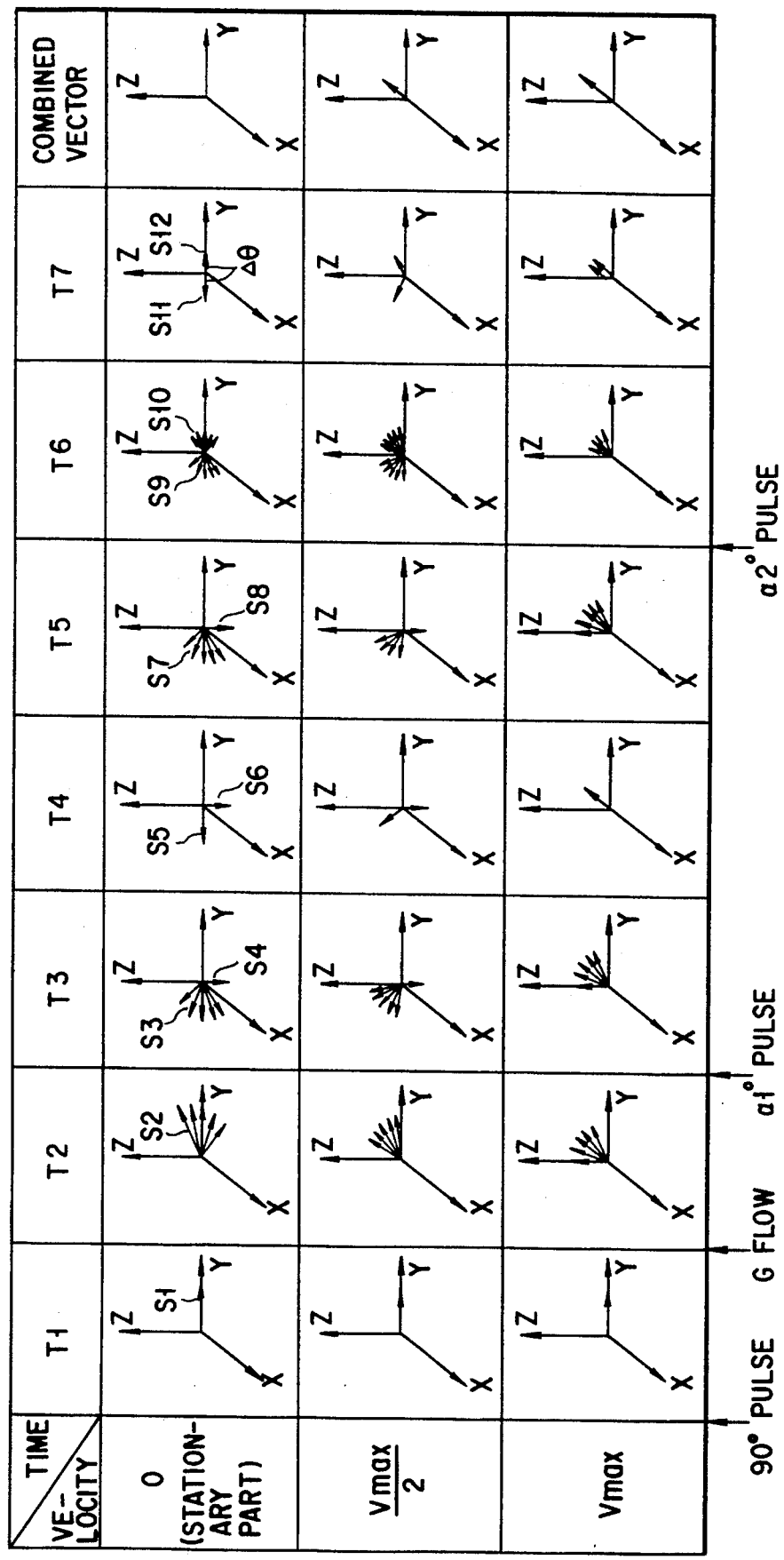
FIG. 5 is a view for explaining the signal processing of the embodiment.

The behavior of a magnetic spin will be described in detail below with reference to FIG. 5. Referring to FIG. 5, the upper column shows the behavior of a magnetic spin when velocity=0, i.e., in a stationary part, and the intermediate and lower columns show the behaviors of magnetic spins when the velocities are $v_{max}/2$ and $v_{max}$, respectively. $V_{max}$ is the velocity corresponding to the maximum luminance. Note that in FIG. 5, the influence of spin phase dispersion in the slice direction brought about by the gradient magnetic field in the slice direction and the influence of an FID signal generated upon application of the refocusing pulse are neglected, since they are not reflected in actual images.

The excitation pulse is applied with respect to the X axis. At time T1 immediately after the application, the magnetization spin flips to the Y axis regardless of the velocity, generating a transverse magnetization component S1.

When $\tau$ seconds elapse from the excitation pulse, the first refocusing pulse is applied at the flip angle $\alpha_1°$ with respect to the X axis. Between the excitation pulse and the first refocusing pulse, the flow encode pulse Gflow is applied with respect to a desired bloodstream direction. After the application of the excitation pulse, the transverse magnetization component S1 of the magnetization spin disperses with a time constant T2*. In this case the central phase is shifted in accordance with velocity by the flow encode pulse Gflow. Time T2 indicates the time immediately before the application of the first refocusing pulse.

At time T3 immediately after the application of the first refocusing pulse, the magnetization spin rotates $\alpha_1°$ about the X axis. Since $\alpha_1° \neq 180°$, e.g., $\alpha_1° = 109.5°$, the magnetization spin after the rotation crosses the XY plane at an angle of 109.5°. Therefore, the magnetization spin after the rotation can be considered to be divided into a transverse magnetization component S3 and a longitudinal magnetization component S4. The advance and delay of the phase of the transverse magnetization component S3 so reverse as to concentrate on the Y axis. The longitudinal magnetization component S4 is the original component of the stimulated echo component. The intensity (length) of the longitudinal magnetization component S4 is constant regardless of the velocity, since it can be regarded as the total sum of the dispersed magnetization spins.

At time T4 when $\tau$ elapses from the first refocusing pulse, the transverse magnetic component S4 rephases into a transverse magnetic component S5. Since there is no influence of a magnetic field, the longitudinal magnetization component S4 keeps its spatial distribution and is maintained as a longitudinal magnetization component S6.

When $2\cdot\tau$ seconds elapse from the first refocusing pulse, the second refocusing pulse is applied at the flip angle $\alpha_2°$ with respect to the X axis. After the time T4, the transverse magnetization component S5 of the magnetization spin disperses with a time constant T2* while holding its central phase. Time T5 indicates the time immediately before the application of the second refocusing pulse. The longitudinal magnetization component S6 keeps its spatial distribution and is maintained as a longitudinal magnetization component S8, because there is no influence of a magnetic field.

At time T6 immediately after the application of the second refocusing pulse, the magnetization spin rotates $\alpha_2°$ about the X axis. Since $\alpha_2° \neq 180°$, e.g., $\alpha_2° = 109.5°$, the transverse magnetization component S7 can be considered to be divided into a transverse magnetization component S10 and a longitudinal magnetization component. Note that this longitudinal magnetization component is omitted since it does not contribute to imaging. The longitudinal magnetization component S8 also can be considered to be divided into a transverse magnetization component S9 and a longitudinal magnetization component. Note that this longitudinal magnetization component also is omitted because it does not contribute to imaging. The advances and delays of the phases of the transverse magnetization components S9 and S10 so reverse as to concentrate on the Y axis.

At time T7 when τ elapses from the second refocusing pulse, the transverse magnetization components S9 and S10 rephase into transverse magnetization components S11 and S12, respectively. The transverse magnetization component S11 is a stimulated echo component, and the transverse magnetization component S12 is a spin echo component. An echo signal to be measured is the combined component of the stimulated echo component S11 and the spin echo component S12.

An angle θV defined between the stimulated echo component S11 and the spin echo component S12 has stored the phase shift caused by the flow encode pulse Gflow. The application phases of the excitation pulse, the first refocusing pulse, and the second refocusing pulse are so determined as to meet Equation (2). As a consequence, in a stationary part the phase difference Δθ between the spin echo component and the stimulated echo component is π; that is, the spin echo component and the stimulated echo component cancel each other out. On the other hand, in a fluid the phase difference Δθ between the spin echo component and the stimulated echo component approaches 0° as the velocity increases, with the result that the spin echo component and the stimulated echo component combine with each other at a rate corresponding to the velocity. This means that the signal from the fluid increases with increasing velocity.

Also, the flip angle $\alpha_1°$ of the first refocusing pulse and the flip angle $\alpha_2°$ of the second refocusing pulse are so determined as to satisfy Equation (6). Accordingly, the absolute value of the signal intensity of the spin echo component becomes equal to the absolute value of the signal intensity of the stimulated echo component.

As a consequence, the signal intensity of the observed echo is 0 in the stationary part and increases with velocity in a fluid. The signal intensity (absolute value), I, of the observed echo in a fluid is given by Equation (7) below:

$$I=2\cdot\sin\theta_v \quad (7)$$

The result is that a velocity image is reconstructed such that only the fluid such as a bloodstream, rather than the stationary part, is imaged with luminance corresponding to the velocity.

Note that although the 2DFT imaging method is illustrated in FIG. 3, another imaging method also can be used.

In this embodiment as discussed above, in a stationary part the absolute values of the spin echo and the stimulated echo are equal and the phase difference between them is 180°. That is, the signal in the stationary part is essentially 0. On the other hand, in a fluid the absolute values of the spin echo and the stimulated echo are equal and the phase difference between them approaches 0° as the velocity increases. That is, the signal intensity of the fluid increases with velocity. This means that subtraction is made unnecessary as signal processing since it is done in the signal acquisition step. The result is simplified signal processing. Also, since it is not necessary to run two different pulse sequences, the imaging time is shortened, and any motor artifact is reduced. Additionally, the S/N ratio is improved because both the spin echo and the stimulated echo contribute to imaging.

Figure 6:
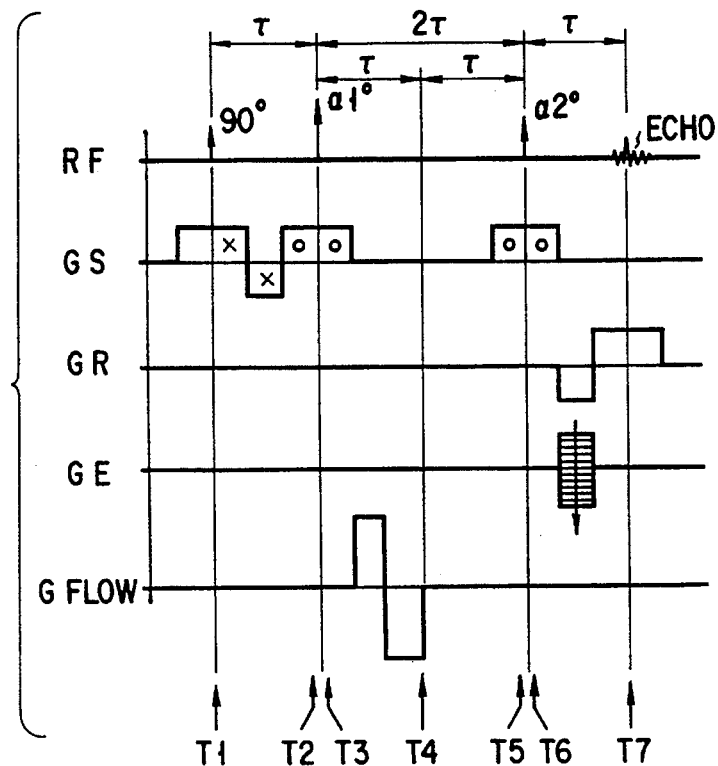
FIG. 6 is a view showing a pulse sequence according to the first modification.
Figure 8:
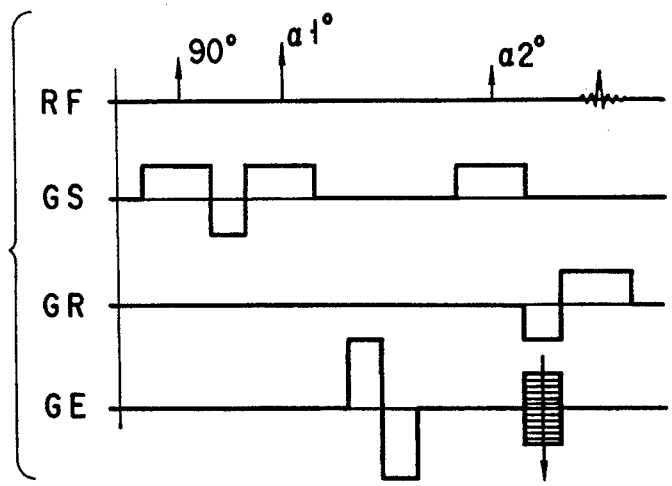
FIG. 8 is a view showing a pulse sequence according to the second modification.
Figure 9:
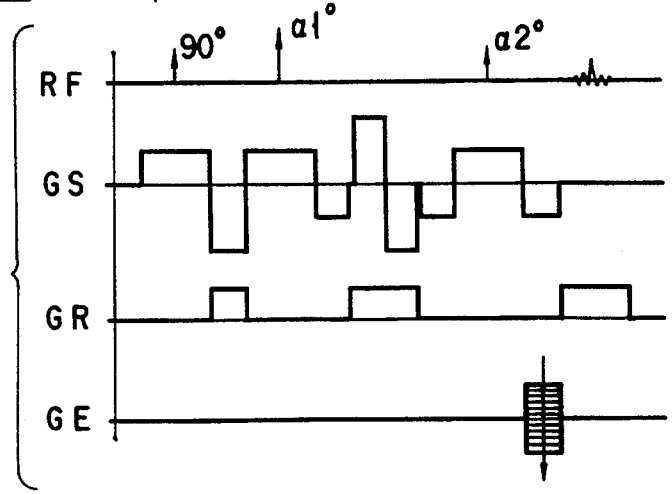
FIG. 9 is a view showing a pulse sequence according to the third modification.
Figure 7:
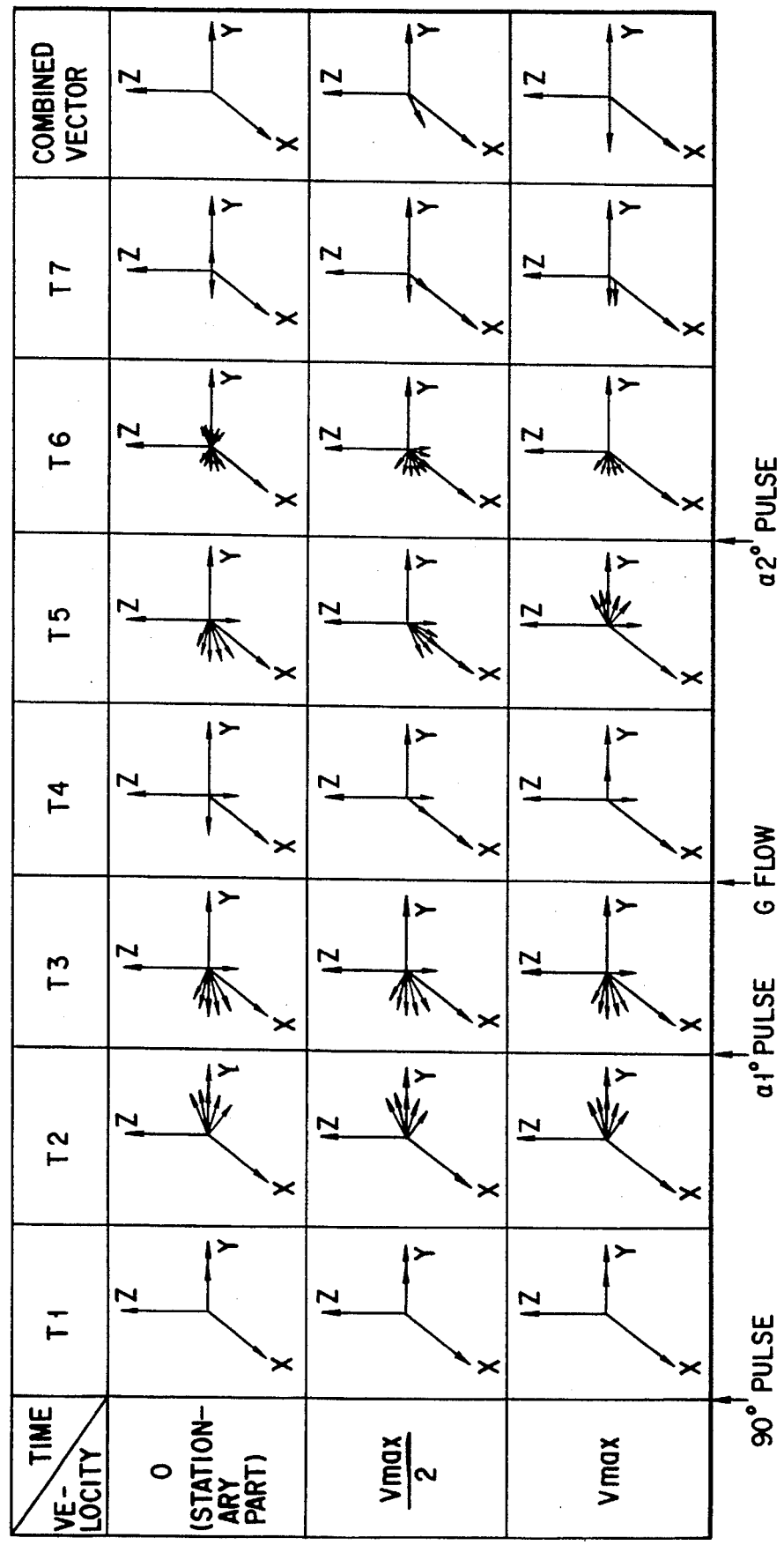
FIG. 7 is a view showing changes with time of the magnetization components of a stationary part, a fluid of $v_{max}/2$, and a fluid of $v_{max}$ in the pulse sequence in FIG. 6.

FIG. 6 shows a pulse sequence according to a modification of the above embodiment. FIG. 7 shows the behaviors of magnetic spins in the pulse sequence in FIG. 6. The flow encode pulse Gflow can be applied between the first and second refocusing pulses. The behaviors in FIG. 7 are nearly identical with those illustrated in FIG. 3, except that the phase shift resulting from the flow encode pulse Gflow takes place between times T3 and T4. The phase of the combined magnetization vector differs from that shown in FIG. 2. However, the absolute values of the echoes contribute to a velocity image, so a velocity image analogous to that shown in FIG. 2 can be attained. Note that the sensitivity of the stimulated echo component to the velocity is lower than that in FIG. 2, because there is no phase change caused by the flow encode pulse. The flow encode pulse need only be applied along the direction of a bloodstream which the operator intends to observe. For example, it is possible to apply the pulse along the phase encode direction, as in FIG. 8, or along the slice direction. Note that FIG. 9 shows a modification in which primary gradient moment nulling is performed.

Figure 10:
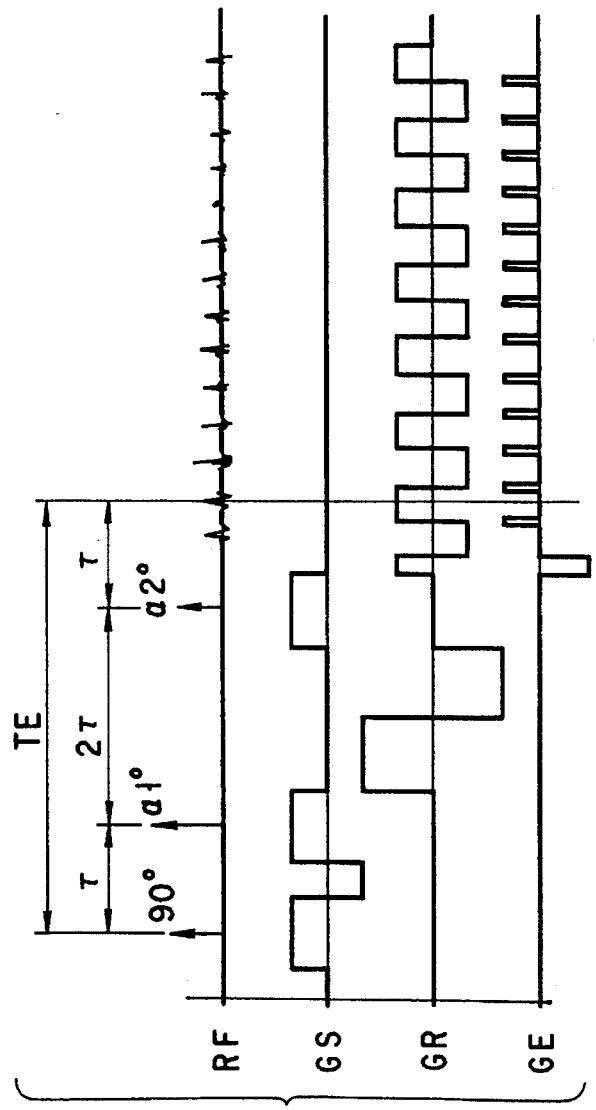
FIG. 10 is a view showing a pulse sequence according to the fourth modification.
Figure 11:
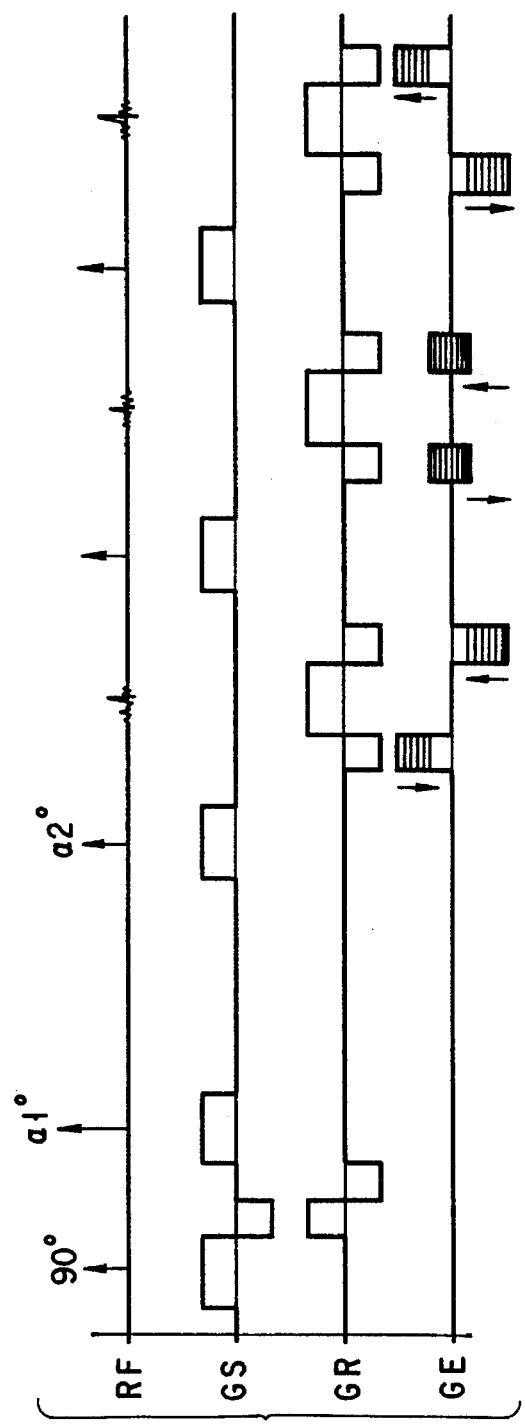
FIG. 11 is a view showing a pulse sequence according to the fifth modification.

FIG. 10 shows a modification in which the present invention is applied to EPI (Echo Planar Imaging). In FIG. 10, an echo not subjected to phase encode is the second echo, and data is sampled asymmetrically in the encode direction. It is desirable to compensate for echo data in an unacquired portion in accordance with a half-Fourier method. FIG. 11 shows a pulse sequence when the present invention is applied to a fast SE method.

Figure 12A:
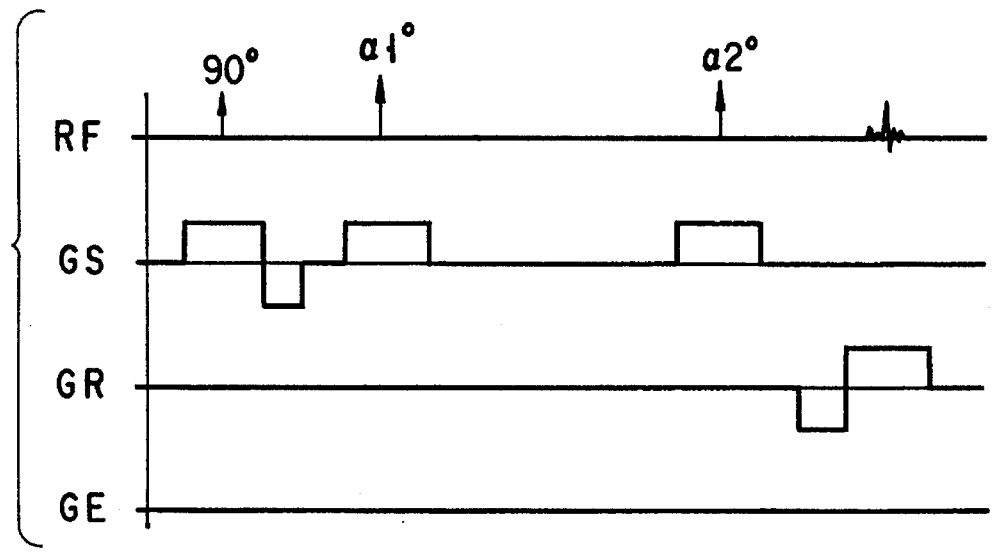
FIGS. 12A and 12B are views showing a pulse sequence for prescan for calculating an optimum value of the flip angle.
Figure 12B:
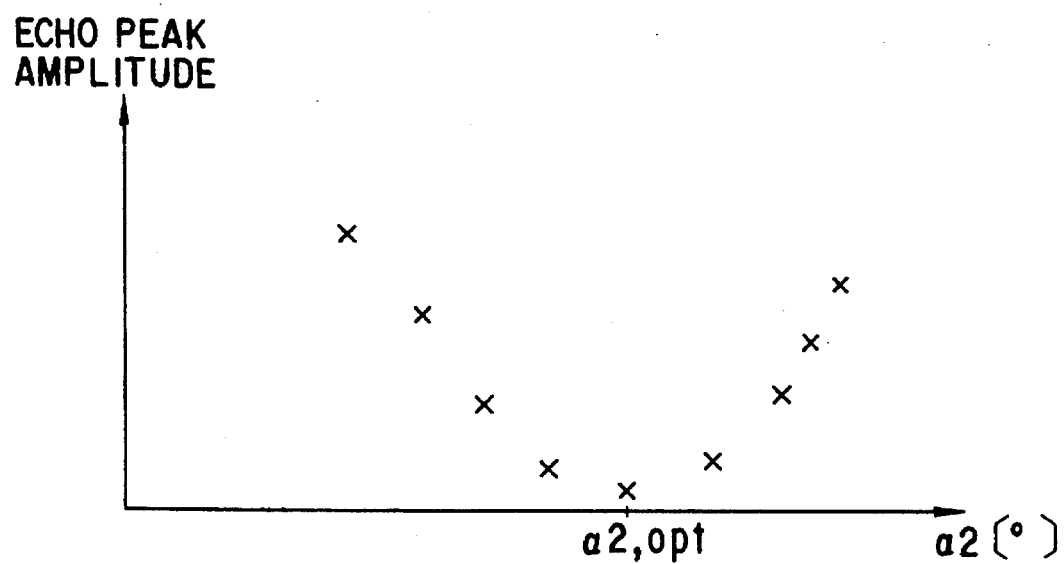

FIG. 12A illustrates a pulse sequence of prescan for calculating an optimum value of the flip angle. Referring to FIG. 12A, the flip angle $\alpha_1°$ of the first refocusing pulse is so fixed that $\alpha_1°=109.5°$ which is theoretically considered to be an optimum value, and the flip angle $\alpha_2°$ of the second refocusing pulse is changed, centered around 109.5°, in steps of a few degrees to a few tens of degrees. Under the conditions the prescan is performed several times. In this manner, as illustrated in FIG. 12B, $\alpha_2 opt°$ is calculated by which the amplitude (absolute value) of the echo peak in a stationary part is optimally 0 or most approximated to 0. By running the pulse sequence in FIG. 2 with this $\alpha_2 opt°$, it is possible to suppress imperfect power adjustment of an RF pulse, nonuniformity of the RF magnetic field distribution caused by the transmission coil, and error of the flip angle brought about by $T_1$ and $T_2$ relaxation of a tissue. Note that it is, of course, possible to calculate an optimum value $\alpha_1 opt°$ by changing $\alpha_1°$ while $\alpha_2°$ is fixed at 109.5°.

The present invention is not limited to the above embodiments but can be practiced in the form of various modifications.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A magnetic resonance imaging apparatus for imaging a fluid having a velocity, comprising:

magnetic gradient coil means for applying a magnetic gradient field to said fluid;

radio-frequency transceiver means for applying an RF signal to said fluid, and for receiving echo signals therefrom;

sequencer means for sequentially causing an excitation pulse, a first refocusing pulse, having a first flip angle, and a second refocusing pulse, having a second flip angle, to be applied by said radio-frequency transceiver means and for causing said radio-frequency transceiver means to receive said echo signals from said fluid after said second refocusing pulse;

said sequencer means for further causing a magnetic flow encode pulse to be applied by said magnetic gradient coil means after said excitation pulse but prior to said second refocusing pulse;

means for adjusting the application phases of said excitation pulse, said first refocusing pulse, and said second refocusing pulse, and for adjusting the angle of said first flip angle, and said second flip angle whereby the intensity of said echo signals received by said radio-frequency transceiver means varies in accordance with said velocity of said fluid; and means for reconstruction an image of said fluid based upon said echo signals received.

2. An apparatus according to claim 1, wherein said adjusting means adjusts said first flip angle of the first refocusing pulse such that a magnetization spin caused to flip by the first refocusing pulse has a transverse magnetization component and a longitudinal magnetization component, the transverse magnetization component has a spin echo component, and the longitudinal magnetization component has a stimulated echo component, and each echo signal is a composite signal of the spin echo component and the stimulated echo component.

3. An apparatus according to claim 2, wherein the adjusting means adjusts the first flip angle of the first refocusing pulse and the second flip angle of the second refocusing pulse such that an absolute value of the spin echo component and an absolute value of the stimulated echo component are substantially equal.

4. An apparatus according to claim 3, wherein the first flip angle $\alpha_1°$ of the first refocusing pulse and the second flip angle $\alpha_2°$ of the second refocusing pulse are adjusted to satisfy the following equation:

$$\sin(\alpha_1/2) \cdot \sin(\alpha_2/2) = 2 \cdot \cos(\alpha_1/2) \cdot \cos(\alpha_2/2).$$

5. An apparatus according to claim 4, wherein the first flip angle $\alpha_1°$ of the first refocusing pulse and the second flip angle $\alpha_2°$ of the second refocusing pulse are set such that $\alpha_1° = \alpha_2° = 109.5°$.

6. An apparatus according to claim 2, wherein the adjusting means adjusts the application phases of the excitation pulse, the first refocusing pulse, and the second refocusing pulse such that in a stationary part the phase of the spin echo component and the phase of the stimulated echo component has a phase difference of 180°, and in the fluid the phase difference between the phase of the spin echo component and the phase of the stimulated echo component approaches 0° with increasing velocity.

7. An apparatus according to claim 6, wherein the adjusting means adjusts the application phase $\phi_0$ of the excitation pulse, the application phase $\phi_1$, of the first refocusing pulse, and the application phase $\phi_2$ of the second refocusing pulse to satisfy $$2 \cdot \phi_0 - 3 \cdot \phi_1 + \phi_2 = 2 \cdot n \cdot \pi$$

where n is an integer.

8. An apparatus according to claim 7, wherein the adjusting means adjusts the application phase $\phi_0$ of the excitation pulse, the application phase $\phi_1$ of the first refocusing pulse, and the application phase $\phi_2$ of the second refocusing pulse such that $\phi_0 = \phi_1 = \phi_2 = 0°$.

9. An apparatus according to claim 8, wherein all of the excitation pulse, the first refocusing pulse, and the second refocusing pulse are applied with respect to the X axis.

10. An apparatus according to claim 6, wherein the adjusting means sets the first flip angle of the first refocusing pulse and the second flip angle of the second refocusing pulse such that absolute values of the spin echo component and the stimulated echo component are substantially equal.

11. An apparatus according to claim 10, wherein the adjusting means sets the first flip angle $\alpha_1°$ of the first refocusing pulse and the second flip angle $\alpha_2°$ of the second refocusing pulse are to satisfy the following equation:

$$\sin(\alpha_1/2) \cdot \sin(\alpha_2/2) = 2 \cdot \cos(\alpha_1/2) \cdot \cos(\alpha_2/2).$$

12. An apparatus according to claim 11, wherein the adjusting means sets the first flip angle $\alpha_1°$ of the first refocusing pulse and the second flip angle $\alpha_2°$ of the second refocusing pulse such that $\alpha_1° = \alpha_2° = 109.5°$.

13. An apparatus according to claim 1, wherein the echo signals are phase and frequency encoded, and the velocity image is reconstructed by performing a two-dimensional Fourier transformation of the echo signals.

14. An apparatus according to claim 1, wherein the echo signals are repetitively acquired after the second refocusing pulse while a gradient magnetic field is reversed.

15. An apparatus according to claim 1, wherein the echo signals are repetitively acquired after the second refocusing pulse while the first and second refocusing pulses are repetitively applied.

16. An apparatus according to claim 1, wherein said sequences means further causes a prescan to be performed such that the echo signals are repetitively acquired while the flip angle of one of the first and second refocusing pulses is fixed and the flip angle of the other is changed, and the flip angle of the other is adjusted such that the intensity of the echo signal in a stationary part is at or near 0.

17. A method of imaging a moving fluid having a velocity in a magnetic resonance imaging apparatus having a magnetic gradient coil means, a radio-frequency transceiver means, and image reconstruction means, said method comprising:

sequentially applying by said radio frequency transceiver means;

an RF excitation pulse;

a first refocusing RF pulse having a first angle;

a second refocusing RF pulse having a second angle;

applying a flow encoded magnetic gradient pulse by said magnetic gradient coil means after said RF excitation pulse and prior to said second refocusing RF pulse;

receiving RF echo signals from said moving fluid by said radio-frequency transceiver means;

reconstructing an image of said fluid based upon said echo signals received by said image reconstruction means.

18. The method of claim 17 wherein said flow encoded pulse is a bipolar pulse having a polarity reversal.

19. The method of claim 18 wherein said bipolar pulse is applied such that the magnetic intensity change is along the direction of the flow of the moving fluid.

20. The method of claim 17 further comprising:

adjusting said first angle such that a magnetization spin caused by said first RF refocusing pulse has a transverse magnetization component and a longitudinal magnetization component; and wherein said transverse magnetization component has a spin echo component and wherein said longitudinal component has a stimulated echo component; and wherein each of said echo signals is a composite signal of the spin component and the stimulated echo component.

21. The method of claim 20 further comprising:

adjusting said first and second angles such that an absolute value of the spin echo component and an absolute value of the stimulated echo component are substantially equal.

22. The method of claim 21 wherein a said first and second angles ($\alpha_1$ and $\alpha_2$ respectively) are adjusted such that $$\sin(\alpha_1/2)\cdot\sin(\alpha_2/2)=2\cdot\cos(\alpha_1/2)\cdot\cos(\alpha_2/2).$$

23. The method of claim 22 wherein said first and second angles are adjusted such that $$\alpha_1=\alpha_2=109.5°.$$

24. The method of claim 20 further comprising:

adjusting the application phase of said RF excitation pulse, the first refocusing RF pulse, and the second refocusing RF pulse such that in a stationary part the phase of the spin echo component and the phase of the stimulated echo component has a phase difference of 180°, and in the fluid the phase of the spin echo component and the phase of the stimulated echo component approaches 0° with increasing velocity.

25. The method of claim 24 wherein said adjusting step adjusts the application phase $\phi_0$ of said RF excitation pulse, the application phase $\phi_1$ of said first refocusing RF pulse, and the application phase $\phi_2$ of said second refocusing RF pulse in accordance with $$2\cdot\phi_0-3\cdot\phi_1+\phi_2=2\cdot n\cdot\pi$$

where R is an integer.

26. The method of claim 25 wherein said adjusting step adjusts the application phase $\phi_0$, $\phi_1$, and $\phi_2$ such that $$\phi_0=\phi_1=\phi_2=0°.$$

27. The method of claim 26 wherein said RF excitation pulse, said first refocusing RF pulse and said second refocusing RF pulse are applied in the X axis.

28. The method of claim 24 wherein said adjusting step adjusts the first angle and the second angle such that the absolute values of the spin echo component and the stimulated echo component are substantially equal.

29. The method of claim 28 wherein said adjusting step adjusts the first angle ($\alpha_1$) and the second angle ($\alpha_2$) satisfy the following equation:

$$\sin(\alpha_1/2)\cdot\sin(\alpha_2/2)=2\cdot\cos(\alpha_1/2)\cdot\cos(\alpha_2/2).$$

30. The method of claim 29 wherein said first angle ($\alpha_1$) and the second angle ($\alpha_2$2) are such that $$\alpha_1=\alpha_2=109.5°.$$

31. The method of claim 17 wherein said reconstructing step further comprises:

performing a two-dimensional Fourier transformation of the echo signals.

32. The method of claim 17 further comprising:

repetitively receiving RF echo signals from said moving fluid after the second RF refocusing pulse while a gradient magnetic field is reversed.

33. The method of claim 17 further comprising:

repetitively receiving RF echo signals from said moving fluid after the second RF refocusing pulse while the first and second RF refocusing pulses are repetitively applied.

34. The method of claim 17 wherein said RF echo signals are repetitively received while the flip angle of one of the first and second RF refocusing pulse is fixed and the flip angle of the other is changed, and the flip angle of the other is adjusted such that the intensity of the echo signal in the stationary part is at or near zero.

* * * * *